US011127623B2

(12) United States Patent
Zang et al.

(10) Patent No.: US 11,127,623 B2
(45) Date of Patent: Sep. 21, 2021

(54) SINGLE DIFFUSION CUT FOR GATE STRUCTURES

(71) Applicant: GLOBALFOUNDRIES U.S. INC., Santa Clara, CA (US)

(72) Inventors: Hui Zang, Guilderland, NY (US); Ruilong Xie, Niskayuna, NY (US); Jessica M. Dechene, Watervliet, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 56 days.

(21) Appl. No.: 16/213,189

(22) Filed: Dec. 7, 2018

(65) Prior Publication Data

US 2020/0185266 A1    Jun. 11, 2020

(51) Int. Cl.
*H01L 21/308*    (2006.01)
*H01L 21/762*    (2006.01)
*H01L 29/66*    (2006.01)
*H01L 27/088*    (2006.01)

(52) U.S. Cl.
CPC .... *H01L 21/76232* (2013.01); *H01L 21/3086* (2013.01); *H01L 27/0886* (2013.01); *H01L 29/66545* (2013.01); *H01L 29/66795* (2013.01)

(58) Field of Classification Search
CPC ................................................ H01L 21/823878
See application file for complete search history.

(56) References Cited

U.S. PATENT DOCUMENTS

| 8,846,491 | B1 | 9/2014 | Pham et al. |
| 8,916,460 | B1 | 12/2014 | Kwon et al. |
| 2014/0117454 | A1 | 5/2014 | Liu et al. |
| 2020/0020570 | A1* | 1/2020 | Sung .................. H01L 21/3065 |

* cited by examiner

*Primary Examiner* — Daniel Whalen
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to single diffusion cut for gate structures and methods of manufacture. The structure includes a single diffusion break extending into a substrate between diffusion regions of adjacent gate structures, the single diffusion break filled with an insulator material and further comprising an undercut region lined with a liner material which is between the insulator material and the diffusion regions.

20 Claims, 7 Drawing Sheets

SINGLE DIFFUSION CUT FOR GATE STRUCTURES

FIELD OF THE INVENTION

The present disclosure relates to semiconductor structures and, more particularly, to a single diffusion cut for gate structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate features due to the critical dimension (CD) scaling and process capabilities.

For example, in the fabrication of FinFET structures, single diffusion breaks become very attractive in standard cell scaling. The processes for fabricating the single diffusion breaks, though, is very challenging in these advanced technology. By way of illustration, conventionally, multiple Rx regions in a semiconductor integrated circuit typically include arrays of parallel extending fins having distal ends abutting the edges of each Rx region. The fin arrays are terminated by dummy gates, which extend laterally across the distal ends of the fins at the edges of the Rx regions. The dummy gates are used to induce symmetrical epitaxial growth of source/drain regions (S/D regions) on the end portions of the fins located between the dummy gates and adjacent active gates.

To fabricate the single diffusion break, a deep trench undercut adjacent to the source and drain epitaxial regions are provided by removing the dummy gate structure (poly material). The deep trench etch undercut damages or removes portions of the epitaxial source and drain regions. This results in smaller source/drain epitaxial volume and electrical contact area compared to that of the source and drain regions located between active gates. The smaller source an drain region volume and contact area can lead to greater contact resistance and degrade device performance.

SUMMARY

In an aspect of the disclosure, a structure comprises a single diffusion break extending into a substrate between diffusion regions of adjacent gate structures, the single diffusion break filled with an insulator material and further comprising an undercut region lined with a liner material which is between the insulator material and the diffusion regions.

In an aspect of the disclosure, a structure comprises: a substrate material; a plurality of metal gate structures on the substrate material and comprising sidewall spacers, metal material and diffusion regions; and a single diffusion break structure between adjacent metal gate structures of the plurality of metal gate structures, the single diffusion break structure comprises: an undercut region in the substrate, adjacent to the diffusion regions; a liner material lining the undercut region; and an insulator material over the liner material and between the adjacent metal gate structures of the plurality of metal gate structures.

In an aspect of the disclosure, a method comprises: forming a plurality of dummy gate structures over fin structures, the plurality of dummy gate structures including sidewall spacers and sacrificial material; forming sacrificial insulator material between adjacent dummy gate structures of the plurality of dummy gate structures; forming a trench with an undercut region in substrate material by removing the sacrificial material of at least one of the dummy gate structures, leaving the sidewall spacers intact, and removing the substrate material below the removed sacrificial material; depositing liner material on sidewalls of the sidewalls of the trench including in the undercut region; extending the trench further into the substrate; and filling the trench with insulator material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a single diffusion cut for gate structures and methods of manufacture. More specifically, the present disclosure provides a single diffusion cut process for advanced FinFET technologies. Advantageously, the single diffusion cut processes eliminate damage and/or defects to epitaxial source/drain regions during replacement metal gate processes, e.g., during deep trench etch processes to remove the dummy gate material. Accordingly, by implementing the processes described herein, device performance can be maintained even at smaller technology nodes, e.g., 10 nm technology node and smaller.

In embodiments, the single diffusion cut includes a dielectric layer between the single diffusion cut isolation and the single diffusion cut gate spacer. In embodiments, the dielectric layer is on an upper portion of the side wall of the single diffusion cut isolation. The dielectric layer will also fill in spacer holes near the source/drain of the gate structure, e.g., transistor.

The single diffusion cut for gate structures of the present disclosure can be manufactured in a number of ways using a number of different tools. In general, though, the methodologies and tools are used to form structures with dimensions in the micrometer and nanometer scale. The methodologies, i.e., technologies, employed to manufacture the single diffusion cut for gate structures of the present disclosure have been adopted from integrated circuit (IC) technology. For example, the structures are built on wafers and are realized in films of material patterned by photolithographic processes on the top of a wafer. In particular, the fabrication of the single diffusion cut for gate structures use three basic building blocks: (i) deposition of thin films of material on a substrate, (ii) applying a patterned mask on top of the films by photolithographic imaging, and (iii) etching the films selectively to the mask.

Figure 1A:
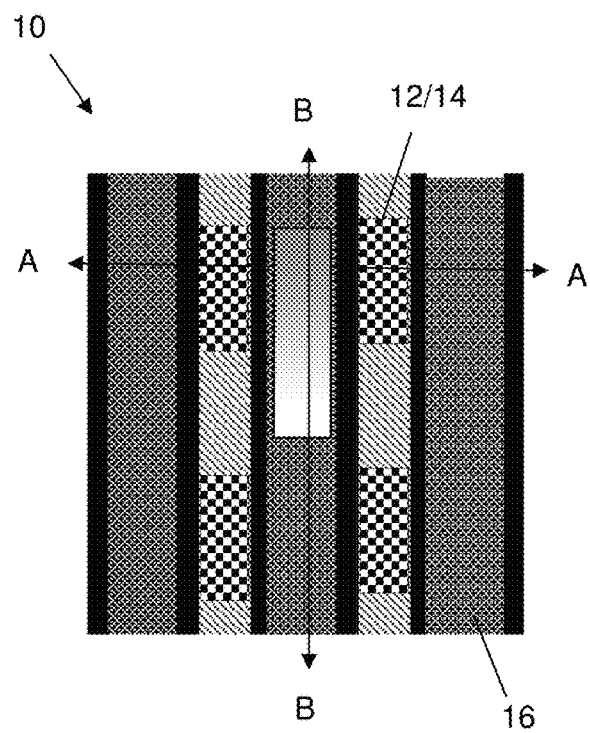
FIG. 1A shows a top view of an incoming structure and respective fabrication processes in accordance with aspects of the present disclosure.
Figure 1C:
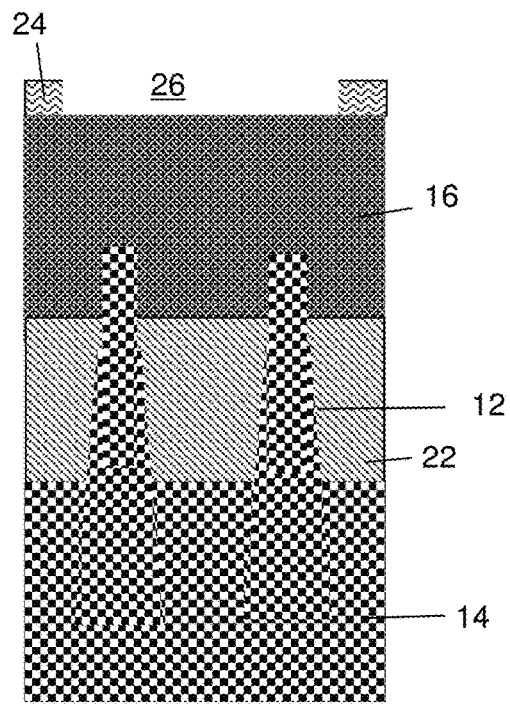
FIG. 1C shows a cross-sectional view along line B-B of FIG. 1A.
Figure 1B:
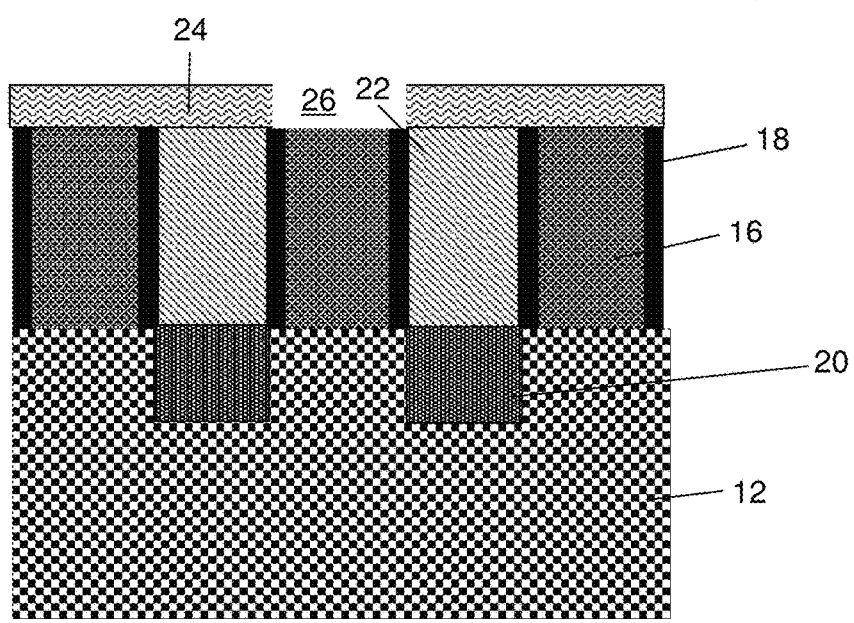
FIG. 1B shows a cross-sectional view along line A-A of FIG. 1A.

FIG. 1A shows a top view of an incoming structure and respective fabrication processes in accordance with aspects of the present disclosure. FIG. 1B shows a cross-sectional view along line A-A of FIG. 1A and FIG. 1C shows a cross-sectional view along line B-B of FIG. 1A. Referring to FIGS. 1A-1C, the structure 10 includes a plurality of fin structures 12 composed of any suitable substrate material 14. In embodiments, the substrate material 14 can be composed of any suitable material including, but not limited to, Si, SiGe, SiGeC, SiC, GaAs, InAs, InP, and other III/V or II/VI compound semiconductors.

The fin structures 12 can be fabricated using conventional patterning processes including, e.g., sidewall imaging transfer (SIT) techniques. In an example of a SIT technique, a mandrel material, e.g., SiO$_2$, is deposited on the substrate material 14 using conventional chemical vapor deposition (CVD) processes. A resist is formed on the mandrel material and exposed to light to form a pattern (openings). A reactive ion etching (RIE) is performed through the openings to form the mandrels. In embodiments, the mandrels can have different widths and/or spacing depending on the desired dimensions between the fin structures 12. Spacers are formed on the sidewalls of the mandrels which are preferably material that is different than the mandrels, and which are formed using conventional deposition processes known to those of skill in the art. The mandrels are removed or stripped using a conventional etching process, selective to the mandrel material. An etching is then performed within the spacing of the spacers to form the sub-lithographic features. Due to the etching process, the fin structures 12 can have a tapered profile as shown in FIG. 1C, for example. The sidewall spacers can then be stripped.

Dummy gate structures 16 extend orthogonally over the fin structures 12. In embodiments, the dummy gate structures 16 are composed of polysilicon material which is deposited over the fin structures 12 and patterned using conventional lithography and etching processes such that no further explanation is required herein for an understanding of the formation of the dummy gate structures. A sidewall spacer material 18 is deposited and patterned over the patterned dummy gate structures 16. In embodiments, the sidewall spacer material 18 is a low-k dielectric material deposited by a conventional CVD process, followed by an anisotropic etching process to expose the upper surface of the polysilicon material of the dummy gate structures 16.

Diffusion regions 20, e.g., source and drain regions, are formed adjacent to the dummy gate structures 16. In embodiments, the source and drain regions 20 can be fabricated by conventional processes including doped epitaxial processes to form raised source and drain regions. In alternative embodiments, the source and drain regions 20 can be planar and subjected to ion implantation or doping processes to form diffusion regions as is known in the art. A sacrificial isolation region 22 is formed over the source and drain regions 20. The sacrificial isolation regions 22 can be, e.g., oxide, deposited by conventional CVD processes, followed by a planarization process such as a chemical mechanical polishing (CMP).

Still referring to FIGS. 1A-1C, a hardmask material 24 is deposited over the sacrificial isolation regions 22 and the dummy gate structures 16. In embodiments, the hardmask material 24 is a nitride material or other hardmask material. An opening 26 is formed in the hardmask material 24. The opening 26 is formed over the fin structures 12 shown in the cross-sectional view of FIG. 1C and over a dummy gate structure 16 shown in the cross-sectional view of FIG. 1B. The opening 26 is fabricated using conventional lithography and etching processes. For example, a resist formed over the hardmask material 24 is exposed to energy (light) to form a pattern (opening). An etching process with a selective chemistry, e.g., RIE, will be used to form one or more openings 26 in the hardmask material 24 through the openings of the resist. The resist can then be removed by a conventional oxygen ashing process or other known stripants.

Figure 2A:
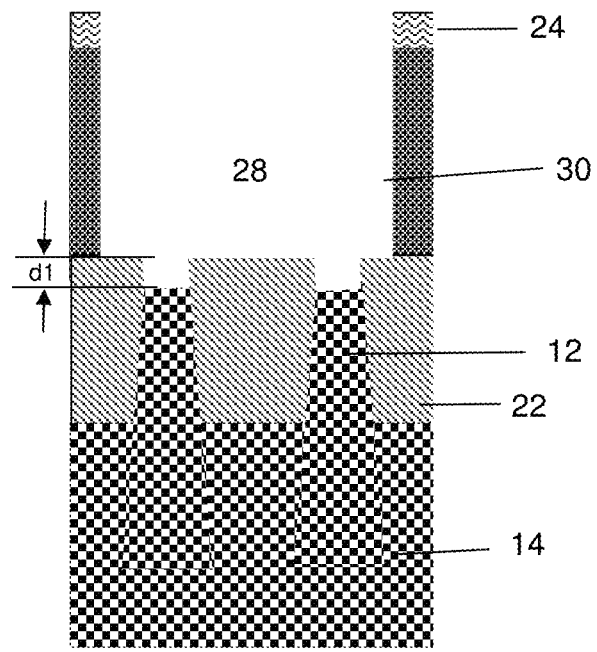
FIGS. 2A and 2B are cross-sectional views showing a trench, amongst other features, and respective fabrication processes.
Figure 2B:
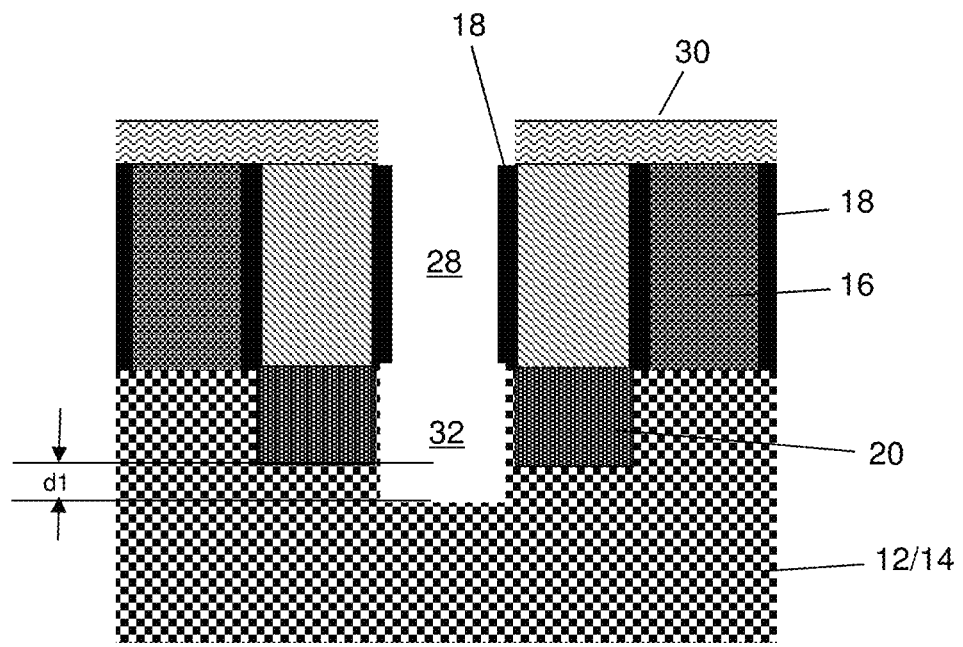

As shown in FIGS. 2A and 2B, a trench 28 is formed through the dummy gate structure and extending into the underlying substrate 14 (e.g., fin structure 14) through the opening of the hardmask material 24 using conventional etching processes, e.g., RIE, with a selective chemistry to the polysilicon material and the substrate material 12. As shown in FIG. 2A, for example, the etching process will remove the polysilicon material of the dummy gate structure 16 and partially remove or recess the fin structures 12. In more specific embodiments, the etching process will recess the fin structures 12 to below a surface of the sacrificial isolation regions 22. In embodiments, the trench 28 will extend to within the substrate 14 and below the source and drain regions 20 by a distance "d1" as shown in FIG. 2B, for example. Accordingly, the recess the fin structures 12 will also be a distance "d1" (as shown in FIG. 2A).

As shown in FIG. 2B, the etching process will remove the poly material between sidewall spacer material 18 and a portion of the fin structure 12 (e.g., substrate) between the source and drain regions 20. In embodiments, the trench 28 in the fin structure 12 includes a wider opening 32 (e.g., undercut region under the fin structure 14) at the bottom portion thereof, e.g., adjacent the source and drain regions 20. The wider opening 32 can be holes in the substrate material, which are adjacent to the source and drain regions 20. The wider opening or holes will not expose the source and drain regions 20.

Figure 3A:
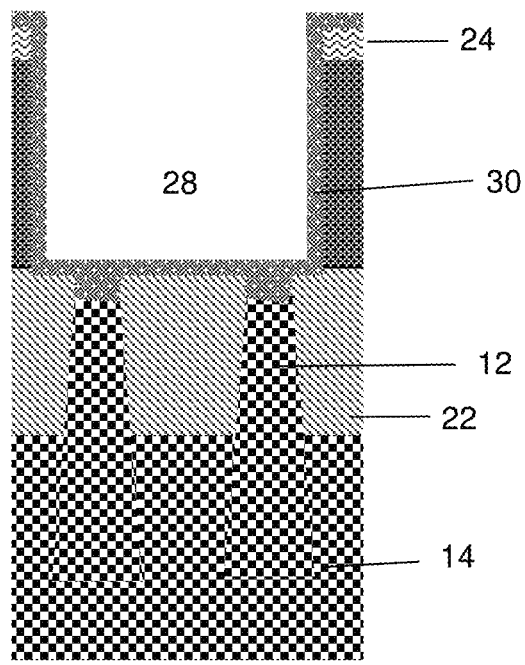
FIGS. 3A and 3B are cross-sectional views showing a liner material formed in the trench, amongst other features, and respective fabrication processes.
Figure 3B:
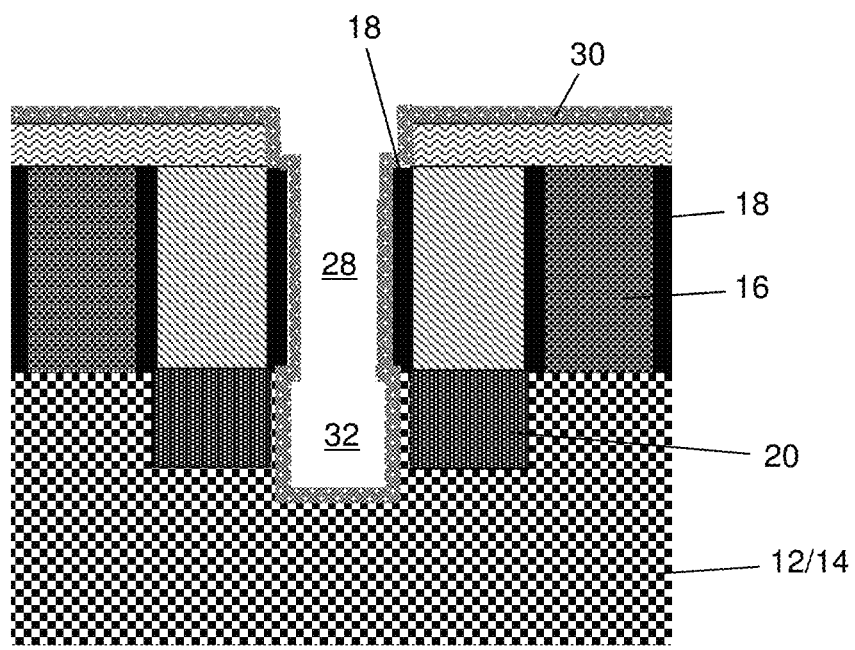

Referring to FIGS. 3A and 3B, a liner material 30 is deposited within the trenches 28, 32. The liner material 30 can be oxide, nitride or other low-k dielectric material, which protects the substrate material 12 and/or fin structure 14 during subsequent etching processes. In embodiments, the liner material 30 is deposited by atomic layer deposition (ALD) or chemical vapor deposition (CVD) or plasma enhanced CVD (PECVD) processes. The liner material 30 will provide complete coverage in the wider opening 32 and the trench 28, as shown in FIG. 3B, to ensure complete protection of the source and drain regions 20 during subsequent etching processes to form the single diffusion break. For example, the liner material 30 can be deposited to a thickness of about 0.5 nm to about 5 nm, and more preferably about 2.5 nm to about 3 nm; although other dimensions are contemplated herein.

Figure 4A:
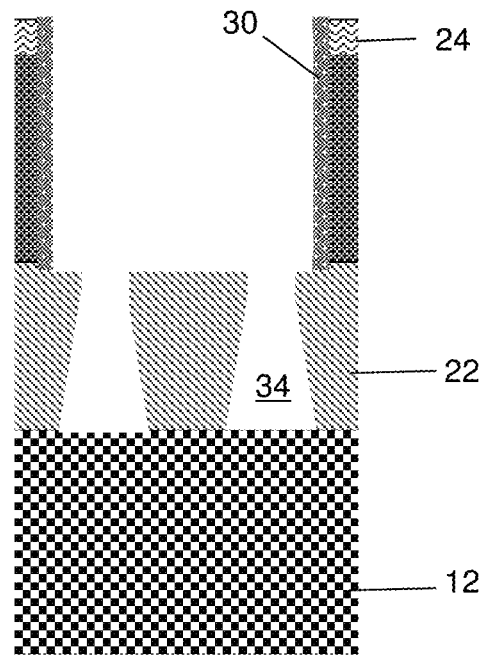
FIGS. 4A and 4B are cross-sectional views showing a single diffusion break cut lined with a liner, amongst other features, and respective fabrication processes.
Figure 4B:
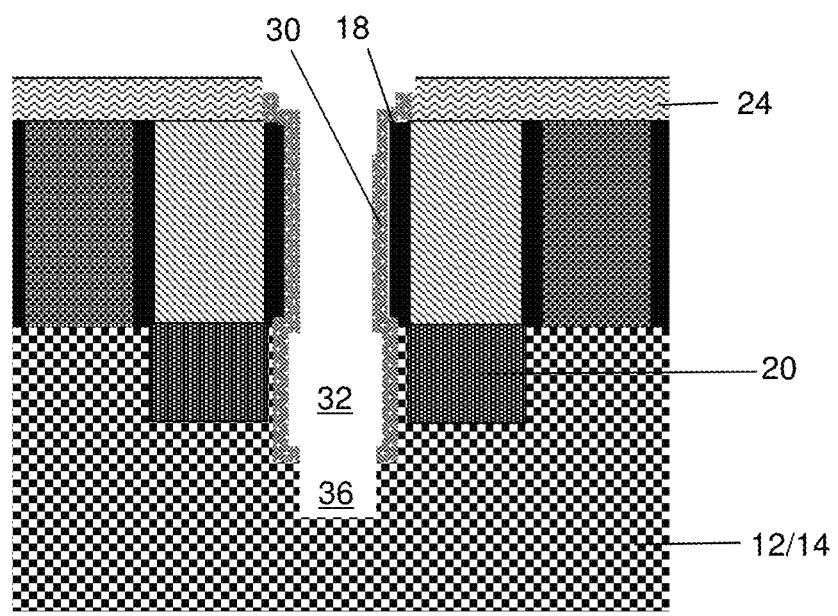

In FIGS. 4A and 4B, the horizontal surfaces of the liner material 30 within the trenches 28, 32 and on the surface of the masking material 24 will be removed by an anisotropic etching process. This process will expose the underlying substrate material 12, including the fin structures. In FIG.

4A, the etching process will continue to remove the fin structure within the isolation regions 22, forming trenches 34 extending into the isolation region 22. Due to the tapered profile of the fin structures, the etching process should preferably include an isotropic etching scheme to ensure that all of the semiconductor material of the fin structures 14 within the isolation region 22 is removed, thereby preventing any shorts from occurring during device operation.

In FIG. 4B, the etching process will extend the trench 32 into the substrate material 14 (as shown by reference numeral 34) to complete the single diffusion break etching process. The liner material 30 will protect the source and drain regions 20 from erosion during this etching process, thereby maintaining (e.g., improving) the source drain profile and reducing any defects that may occur during the etching process.

Figure 5A:
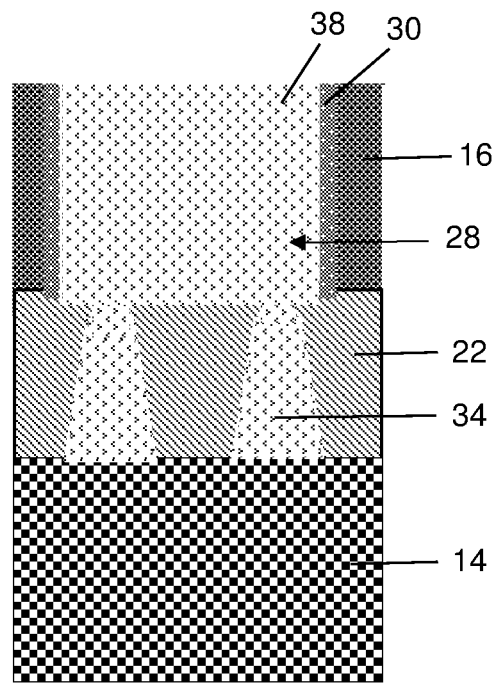
FIGS. 5A and 5B are cross-sectional views which show an insulator material within the single diffusion break cut, amongst other features, and respective fabrication processes.
Figure 5B:
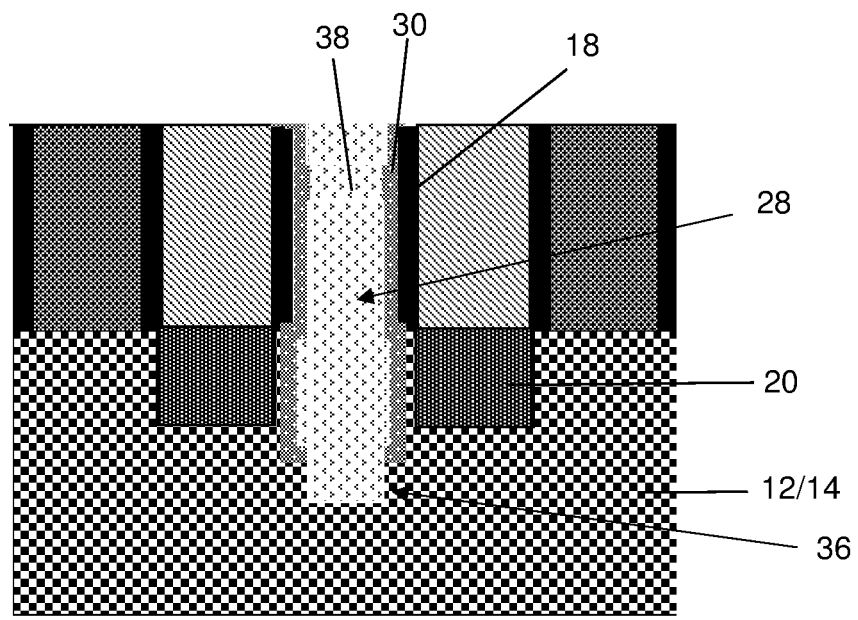
Figure 7:
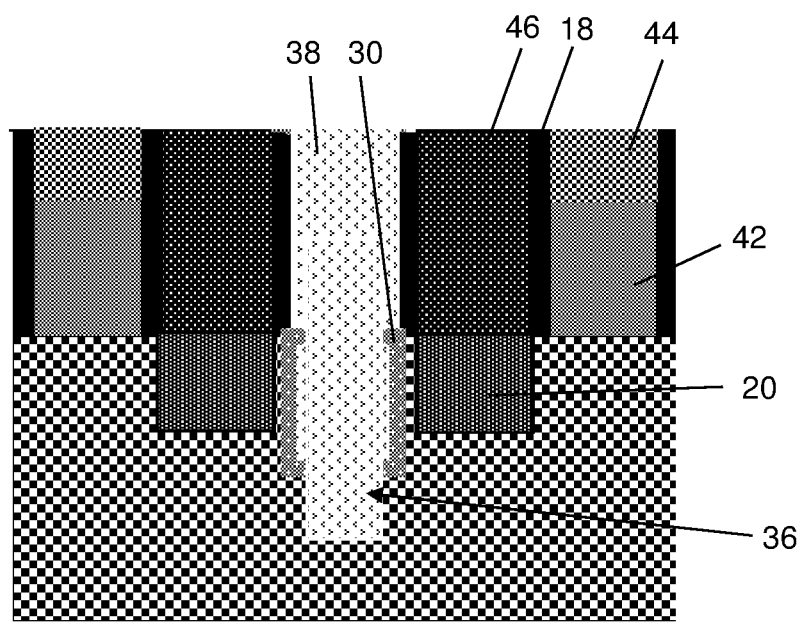
FIG. 7 is a cross-sectional view which shows replacement metal gate structures with a partial liner, amongst other features, and respective fabrication processes.

As shown in FIGS. 5A and 5B, the trenches 28, 34, 36 are filled with an insulator material 38. The insulator material 38 can be a low-k dielectric material deposited by a conventional CVD process, followed by a CMP process. In embodiments, the low-k dielectric material can be SiN, low-k SiCOH or other dielectric materials. As shown in FIG. 5B, for example, the liner material 30 will be an intervening layer between the liner 18 and the insulator material 38 at an upper portion of the trench, in addition to an intervening layer between the substrate material 14 and the insulator material 38 at a lower portion of the trench. As to the latter feature, the liner material 30 protects the epitaxial source and drain regions 20 ensuring that the volume or the profile of the epitaxial source and drain regions 20 will not be affected by the processing steps forming the single diffusion break. It is also contemplated that the upper portion of the liner material 30, adjacent to the sidewall spacer material 18, can be removed prior to the deposition of the low-k dielectric material (see, e.g., FIG. 7).

Figure 6A:
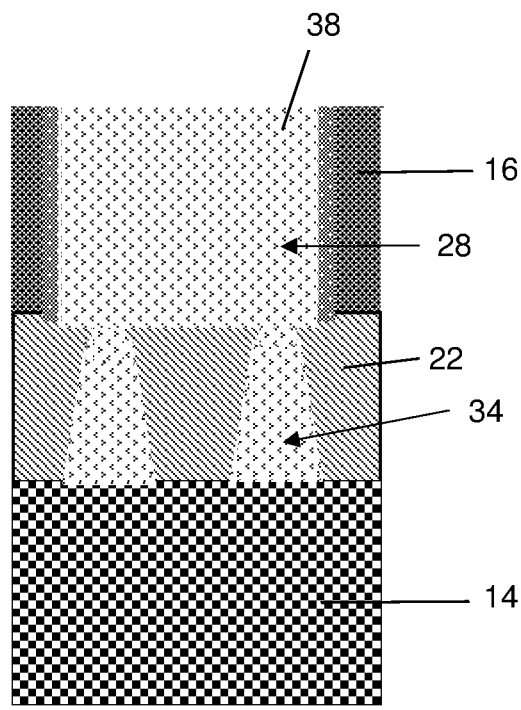
FIGS. 6A and 6B are cross-sectional views which show replacement metal gate structures, amongst other features, and respective fabrication processes.
Figure 6B:
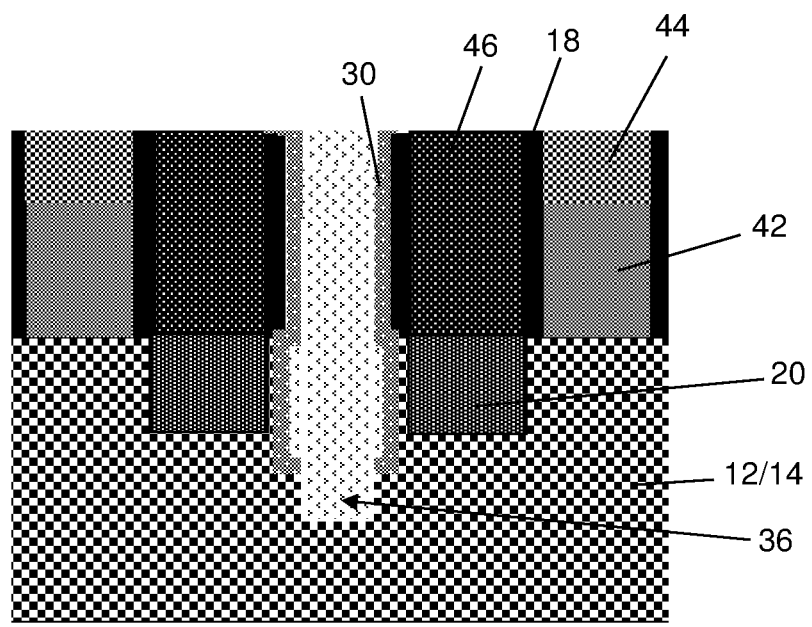

FIGS. 6A and 6B are cross-sectional views which show replacement metal gate structures, amongst other features, and respective fabrication processes. More specifically, in FIGS. 6A and 6B, the polysilicon material of the dummy gate structures are removed and replaced with replacement gate materials 42, 44. In embodiments, polysilicon material of the dummy gate structures can be removed by a selective etch chemistry process. The material 42 can be composed of a high-k dielectric material and a metal material, e.g., tungsten or other workfunction metal, and the material 44 can be a capping material such as nitride. In embodiments, the materials 42, 44 can be deposited by a conventional deposition process, followed by a CMP process.

Still referring to FIGS. 6A and 6B, the sacrificial isolation regions, e.g., oxide, is removed by a conventional selective etch chemistry process and replaced with a contact material 46 in contact with the source and drain regions 20. In embodiments, the contact material 46 can be aluminum or copper, as examples.

As should be understood by those of skill in the art, the source and drain regions 20 can undergo a silicide process prior to contact formation. The silicide begins with deposition of a thin transition metal layer, e.g., nickel, cobalt or titanium, over fully formed and patterned semiconductor devices (e.g., doped or ion implanted source and drain regions 20). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a single diffusion break extending into a substrate between diffusion regions of adjacent gate structures, the single diffusion break filled with an insulator material and further comprising an undercut region and a trench extending from an underside of the undercut region, the undercut region being lined with a liner material which is between the insulator material and the diffusion regions and the trench being devoid of the liner material, and further comprising contact material connecting to the diffusion regions, a sidewall spacer material lining the contact material, and the liner material being in contact with the sidewall spacer material.

2. The structure of claim 1, wherein the liner material is a low-k dielectric material and the contact material is a metal material.

3. The structure of claim 2, wherein the low-k dielectric material is an oxide or nitride material.

4. The structure of claim 2, wherein the liner material has a thickness of about 0.5 nm to 5 nm.

5. The structure of claim 4, wherein the liner material has a thickness of about 2.5 nm.

6. The structure of claim 1, wherein the undercut region is provided in a fin structure composed of the substrate and the liner material only lines the undercut region.

7. The structure of claim 6, wherein the undercut region is adjacent to the diffusion regions and is lined with the liner material at its upper portion.

8. The structure of claim 7, wherein the liner material is provided above the undercut region.

9. The structure of claim 8, wherein the liner material above the undercut region is adjacent to and in contact with the sidewall spacer material.

10. A structure comprising:
a substrate material;
a plurality of metal gate structures on the substrate material and comprising sidewall spacers, metal material and diffusion regions; and
a single diffusion break structure between adjacent metal gate structures of the plurality of metal gate structures, the single diffusion break structure comprising:
   an undercut region in the substrate, adjacent to the diffusion regions;
   a trench extending from an underside the undercut region;
   a liner material lining the undercut region; and
   an insulator material over the liner material and between the adjacent metal gate structures of the plurality of metal gate structures,
wherein the trench is devoid of the liner material.

11. The structure of claim 10, wherein the liner material is a low-k dielectric material.

12. The structure of claim 11, wherein the low-k dielectric material is an oxide or nitride material.

13. The structure of claim 12, wherein the liner material has a thickness of about 0.5 nm to 5 nm.

14. The structure of claim 10, wherein the undercut region is provided in a fin structure composed of the substrate material, and the sidewall spacers are adjacent to the diffusion regions which are devoid of the liner material along an extent of contact material.

15. The structure of claim 14, wherein the substrate material is between the liner material and the diffusion regions, and the sidewall spacers adjacent to the diffusion regions are in contact with contact material connecting to the diffusion regions.

16. The structure of claim 15, wherein the liner material is provided above the undercut region and adjacent to the sidewall spacers of the adjacent metal gate structures.

17. The structure of claim 10, wherein the liner material is structured to protect erosion of the diffusion regions during formation of the undercut region and the liner material contacts the sidewall spacers which, in turn, contact conductive material connecting to the diffusion regions.

18. The structure of claim 17, wherein the undercut region is an openings in the substrate material, adjacent to the diffusion regions.

19. A method, comprising:
forming a plurality of dummy gate structures over fin structures composed of a substrate, the plurality of dummy gate structures including sidewall spacers and sacrificial material;
forming diffusion regions adjacent to the dummy gate structures;
forming an undercut region in the substrate by removing substrate material while leaving the sidewall spacers intact;
depositing liner material in contact with the sidewall spacers on sidewalls of the undercut region;
extending the undercut region by forming a trench further into the substrate, wherein the trench is devoid of the liner material;
filling the trench with insulator material; and
forming the contact material connecting to the diffusion regions, the contact material contacting the sidewall spacers.

20. The method of claim 19, wherein the liner material is a low-k dielectric material.

* * * * *